(12) United States Patent
Waffenschmidt et al.

(10) Patent No.: US 6,707,662 B2
(45) Date of Patent: Mar. 16, 2004

(54) PLANAR POLYMER CAPACITOR

(75) Inventors: Eberhard Waffenschmidt, Aachen (DE); Peter Luerkens, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/288,133

(22) Filed: Nov. 5, 2002

(65) Prior Publication Data

US 2003/0090858 A1 May 15, 2003

(30) Foreign Application Priority Data

Nov. 10, 2001 (DE) .......................... 101 55 393

(51) Int. Cl.⁷ .............................. H01G 9/00; H01G 9/04
(52) U.S. Cl. .................... 361/523; 361/528; 29/25.03
(58) Field of Search ................... 361/523, 528, 361/529, 511, 508, 516, 530, 504; 29/25.03

(56) References Cited

U.S. PATENT DOCUMENTS

| | | | |
|---|---|---|---|
| 5,586,001 A | * 12/1996 | Amano et al. | 361/525 |
| 6,212,064 B1 | 4/2001 | Aoki et al. | 361/523 |
| 6,377,468 B1 | * 4/2002 | Ohtani et al. | 361/783 |

FOREIGN PATENT DOCUMENTS

| | | | | |
|---|---|---|---|---|
| EP | 0591035 A1 | 4/1994 | ............ | H01G/9/02 |
| EP | 1100295 A2 | 5/2001 | ............ | H05K/1/16 |
| GB | 2255450 A | 11/1992 | ............ | H05K/1/18 |

* cited by examiner

Primary Examiner—Anthony Dinkins
(74) Attorney, Agent, or Firm—Aaron Waxler

(57) ABSTRACT

The invention concerns an electronic component, the application of a component of this kind and a method for manufacturing a component of this kind with capacitive characteristics. In order to integrate an electrolytic capacitor into integrated circuits, it is suggested that a polymer electrolytic capacitor be of laminated, planar execution. It thereby becomes possible to integrate an electrolytic capacitor into a printed circuit board, as a result of which the overall height, the production capability and the electromagnetic compatibility of a circuit of this kind are improved.

14 Claims, 2 Drawing Sheets

PLANAR POLYMER CAPACITOR

The invention concerns an electronic component with capacitive characteristics, in particular capacitors with at least a first electrode, which electrode is equipped with a conductive layer, with at least a second electrode, which electrode is equipped with a conductive layer, and with at least a conductive polymer layer arranged between the first and second electrodes.

The invention further concerns a method for producing a component of this kind, and the application of a component of this kind in flat screens.

Electrolytic capacitors are important components of an electronic circuit. Since they are characterized by a very high energy density, they are generally used as energy stores. These energy stores are required in most electronic circuits. However, electrolytic capacitors occupy up to one third of the volume of a circuit, thereby frequently determining the overall height of the entire circuit.

An electrolytic capacitor is known from publication U.S. Pat. No. 6,212,064 B1, in which no conductive electrolytic fluid is located between the electrodes, and instead a conductive polymer serves as the electrolyte. This wound capacitor is equipped with a first electrode. This first electrode is acted upon by a conductive layer. A second electrode is also provided, this being covered with a dielectric layer. Between the dielectric layer of the second electrode and the conductive layer of the second electrode is arranged a polymer layer as the electrolyte. Owing to the use of the polymer layer, sealing of the housing can largely be dispensed with since no electrolytic fluid can escape from the capacitor.

The disadvantage of the arrangement described is, however, that this polymer capacitor cannot be integrated into circuits. Its overall height does not allow for a miniaturized circuit.

Departing from the electrolytic capacitor described, the object of the invention is to make available an electrolytic capacitor with a high integration capability.

This object is achieved according to the invention in that the electrodes and the polymer layer exhibit at least single planar lamination, and that at least one conductive layer is equipped with at least one dielectric layer. It is thereby possible, by contrast with known capacitive solutions for printed circuit boards, to integrate a capacity that is greater by several orders of magnitude. Owing to the planar design, the electrolytic capacitors may be of ultra-thin, planar design, and higher form factors can be achieved than hitherto. Furthermore, the use of plastic polymers is better by far, since a housing can be dispensed with. Further, a toxic electrolytic fluid can also be dispensed with, increasing the environmental compatibility of capacitors according to the invention. Finally, electrolytic capacitors according to the invention can be readily recycled, since a standardized recycling method can be implemented owing to the laminated structure.

Owing to the structure according to the invention, the capacity of the capacitor according to the invention can be increased. The dielectric strength, electric losses and thermal characteristic/frequency response of the capacitor can also be adjusted. This is possible, in particular, because of the use of a dielectric layer.

In the case of an arrangement as claimed in claim 2, the capacitor is already arranged on or in a circuit base. A circuit base may be either a printed circuit board or a semiconductor base. This semiconductor base may be, for instance, a silicon crystal, to which electronic components can be applied using suitable methods, such as etching, epitaxial growth or vapor-deposition. The overall height, the electromagnetic compatibility and the production capability of circuit bases of this kind with capacitive characteristics can be improved through integration into the circuit base. The overall height of a circuit can be considerably reduced by means of integration into a circuit base. The overall size of the circuit can also be reduced, since the distances between individual integrated components can be smaller. If the capacitor is arranged within the printed circuit board, it does not occupy the surface of the printed circuit board, as a result of which a higher integration density can be achieved.

Through the integration of different components in a circuit base as claimed in claim 3, an integrated circuit can be implemented on just one circuit base. The manufacturing process for an integrated circuit of this kind is simple, since the various components can be applied to the circuit base using joint processes. Some examples of components of this kind are diodes, resistors, integrated coils, LCT components, switches, integrated circuits and filters.

Owing to the lamination as claimed in claim 4, a higher integration density can be achieved. Each individual layer can accommodate different components side by side. Because of the laminated arrangement, the distance between individual components is reduced, as a result of which electromagnetic compatibility is improved. Interference can be better compensated thanks to the multi-layer structure.

According to an arrangement as claimed in claim 5, the individual layers can exhibit different characteristics. So, for example, materials with different permeabilities can be applied, thereby altering the magnetic characteristics of an individual layer. Materials with different dielectric constants can also be applied to one layer. Further, one layer can be executed as a resistive layer. Finally, it is still possible for one layer to consist of doped and undoped semiconductor elements, so that semiconductor components can be implemented on the layers. Because different layers exhibit different characteristics, virtually all functions can be implemented on just one circuit base.

Owing to the structuring as claimed in claim 6, different capacitors can be implemented in one layer. The structure can be implemented in each layer by means of suitable methods, such as etching.

According to a further subject matter of the invention, the use of an above-described electronic component in flat screens or for power converters is suggested. Plasma screens, in particular, are possibilities here. Owing to the integration of electrolytic capacitors into the printed circuit board, a thin construction of the flat screen can be achieved.

According to a further subject matter of the invention, a method for manufacturing an above-described component is cited, in which at least a first conductive layer is applied to a circuit base, where at least a dielectric is applied to the first layer, where at least a polymer layer is applied to the dielectric, and where at least a second conductive layer is applied to the polymer layer.

Preferred applications of the component according to the invention derive from claims 10 to 15.

The invention will be further described with reference to examples of embodiments shown in the drawings to which, however, the invention is not restricted.

Figure 1:
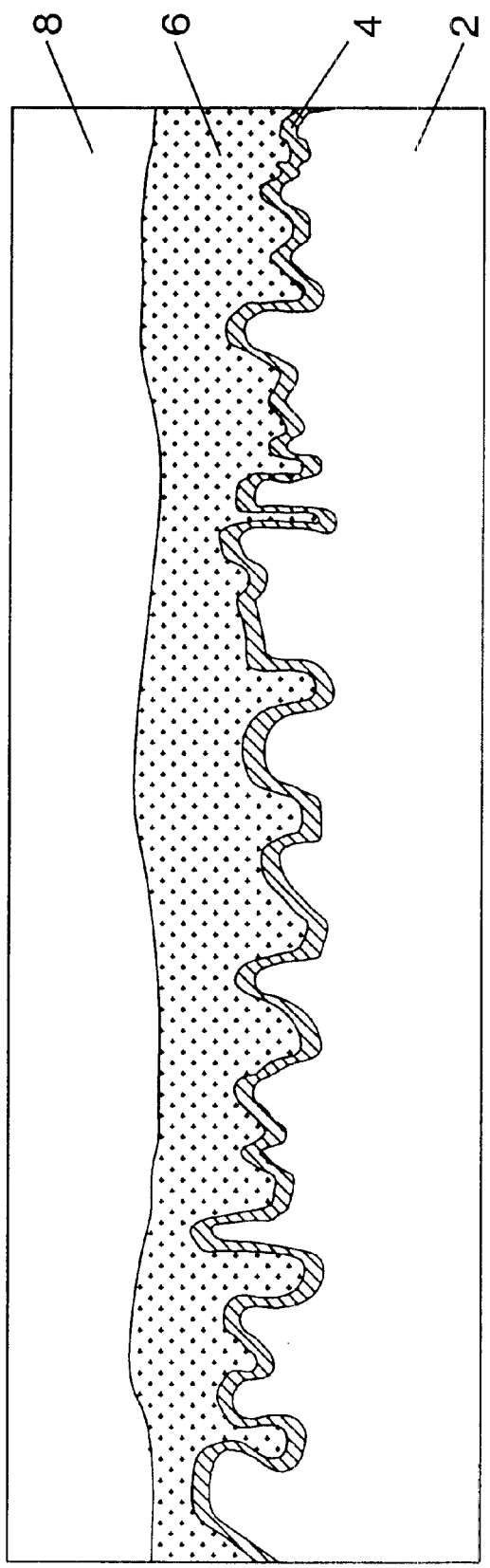
FIG. 1 shows the structure in principle of a laminated capacitor.

FIG. 1 shows the lamination of a polymer capacitor. Between a first electrode 2 and a second electrode 8 are arranged a polymer layer 6 and a dielectric layer 4. The conductive polymer plastic 6 ensures electrical contact between the second electrode 8 and the dielectric layer 4.

In order to produce a structure of this kind, an initially fluid polymer plastic is normally used, this being solidified in a second work step, for example by heating.

Figure 2:
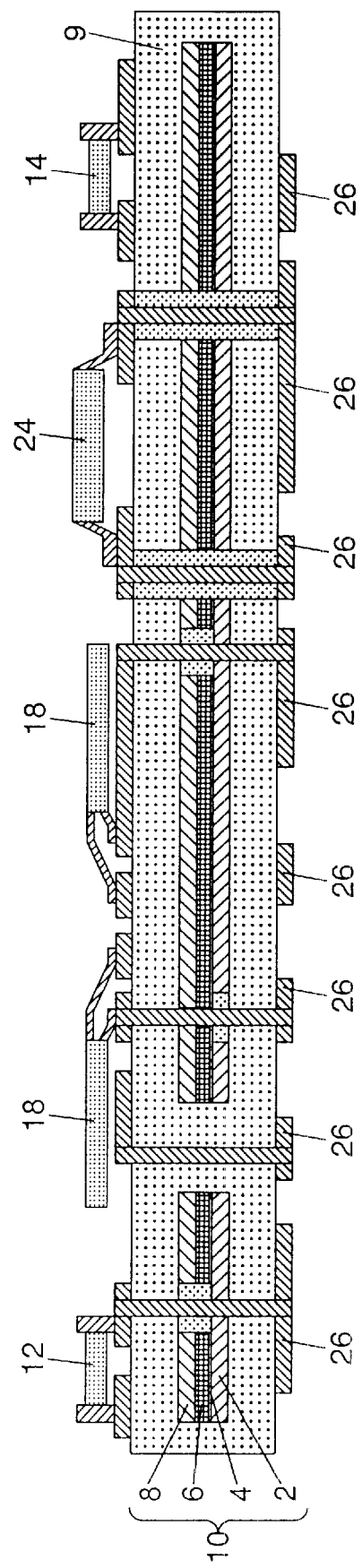
FIG. 2 shows an integrated circuit with capacitive components according to the invention.

The first electrode 2 is usually an aluminum film. This is strongly roughened to increase the surface. Subsequently, a thin, continuous aluminum oxide layer or a similar dielectric insulator is formed on the film as dielectric layer 4. The fluid polymer plastic is applied to the rough dielectric layer 4, and penetrates all the unevenesses. As a result, uniform contact is ensured between the dielectric 4 and polymer plastic 6. In the next work step, the polymer plastic 6 is solidified. Subsequently, it can form a uniform contact with the second electrode 8. Owing to the planar execution, components of this kind can also be used in integrated circuits, as shown in FIG. 2. They can also be arranged in the interior of a PCB.

FIG. 2 shows a cross-section of a circuit according to the invention. The circuit shown here can be used as, for example, a power converter. A circuit base 9 is shown. As shown, the circuit base 9 is divided into several layers. Thus, the circuit base contains capacitive layers 10, which are formed by a first electrode 2, dielectric layer 4, polymer plastic 6 and a second electrode 8. Further located on the circuit base 9 are resistors 12, diodes 14, transistors 18 and a control IC 24. The individual elements are connected to one another both horizontally and vertically via leads 26. Each individual layer can be structured, and thereby simulate different components. Owing to the integration of different components on and in the one circuit base 9, a high integration density is achieved.

For the first time, the planar execution of the electrolytic capacitors enables highly integrated circuits to be made available with high capacitive characteristics. Integrated circuits which, in addition to having a high capacity, are also of low overall height, can be produced for the first time.

List of Reference Numbers
2 First electrode
4 Dielectric layer
6 Polymer plastic
8 Second electrode
9 Circuit base
10 Capacitive layer
12 Resistors
14 Diodes
18 Transistors
24 Control IC
26 Leads

What is claimed is:

1. An electronic component with capacitive characteristics, in particular capacitors with at least a first electrode (2), which first electrode is equipped with a conductive layer, with at least a second electrode (8), which second electrode is equipped with a conductive layer, and with at least a conductive polymer layer (6) arranged between the first and second electrodes (2, 8), characterized in that the electrodes and the polymer layer exhibit at least single planar lamination, and that at least one conductive layer is equipped with at least one dielectric layer (4) and characterized in that the electronic component is arranged on or in a circuit base.

2. An electronic component as claimed in claim 1, characterized in that the circuit base (9) is equipped with additional passive (10-22) and/or active (24) electronic components.

3. An electronic component as claimed in claim 1, characterized in that the circuit base (9) is equipped with multiple lamination.

4. An electronic component as claimed in claim 1, characterized in that the circuit base is equipped with a semiconductor layer, a soft-magnetic layer, a dielectric layer and/or a resistive layer.

5. An electronic component as claimed in claim 1, characterized in that the electrodes (2, 8) and/or the polymer layer (6) are applied in structured form onto or into the circuit base (9).

6. An electronic component as claimed in claim 1, characterized in that the circuit base (9) is a printed circuit board.

7. A method for manufacturing a component as claimed in claim 1, in which at least a first conductive layer is applied to a circuit base, where at least a dielectric is applied to the first layer, where the at least a conductive polymer layer is applied to the dielectric, and where at least a second conductive layer is applied to the polymer layer.

8. An application of an electronic component as claimed in claim 1 in flat screens.

9. An application of an electronic component as claimed in claim 1 in power converters, in particular switched-mode power supplies.

10. An application of an electronic component as claimed in claim 9 as a filter capacitor.

11. An application of an electronic component as claimed in claim 9 as an energy store, in particular a buffer store, for bypassing mains failures, in particular with a length of one or more mains half-waves in the ms range.

12. An application of an electronic component as claimed in claim 9 as functional capacitors in timing or control circuits.

13. An application of an electronic component as claimed in claim 1, characterized in that it serves as an isolator of HF signals in DC bias (direct current process) conductors.

14. An application of an electronic component as claimed in claim 1, characterized in that it serves as a decoupling capacitor for decoupling the supply voltages of circuit components or Ics from each other.

* * * * *